(12) United States Patent
Eguchi

(10) Patent No.: US 9,246,080 B2
(45) Date of Patent: Jan. 26, 2016

(54) FERROELECTRIC THIN FILM AND METHOD FOR PRODUCING SAME

(75) Inventor: Hideyuki Eguchi, Chiyoda-ku (JP)

(73) Assignee: KONICA MINOLTA, INC., Tokyo (JP)

( * ) Notice: Subject to any disclaimer, the term of this patent is extended or adjusted under 35 U.S.C. 154(b) by 54 days.

(21) Appl. No.: 14/005,200

(22) PCT Filed: Feb. 8, 2012

(86) PCT No.: PCT/JP2012/052805
§ 371 (c)(1),
(2), (4) Date: Sep. 13, 2013

(87) PCT Pub. No.: WO2012/124409
PCT Pub. Date: Sep. 20, 2012

(65) Prior Publication Data
US 2014/0004379 A1  Jan. 2, 2014

(30) Foreign Application Priority Data

Mar. 15, 2011  (JP) ................. 2011-056081

(51) Int. Cl.
| | |
|---|---|
| *H01L 41/187* | (2006.01) |
| *H01L 49/02* | (2006.01) |
| *H01L 41/316* | (2013.01) |
| *C30B 23/02* | (2006.01) |
| *C30B 29/32* | (2006.01) |
| *C23C 14/00* | (2006.01) |
| *C23C 14/08* | (2006.01) |

(Continued)

(52) U.S. Cl.
CPC ........ *H01L 41/1876* (2013.01); *C23C 14/0036* (2013.01); *C23C 14/088* (2013.01); *C23C 14/352* (2013.01); *C30B 23/025* (2013.01); *C30B 29/32* (2013.01); *H01L 28/55* (2013.01); *H01L 41/316* (2013.01); *H01L 21/022* (2013.01); *H01L 21/02197* (2013.01); *H01L 21/02266* (2013.01); *Y10T 428/12812* (2015.01)

(58) Field of Classification Search
None
See application file for complete search history.

(56) References Cited

U.S. PATENT DOCUMENTS

| | | | |
|---|---|---|---|
| 2002/0076875 A1 | 6/2002 | Wasa et al. | |
| 2002/0186948 A1* | 12/2002 | Bazylenko et al. | ........... 385/131 |
| 2007/0002103 A1 | 1/2007 | Wasa et al. | |

(Continued)

FOREIGN PATENT DOCUMENTS

| | | |
|---|---|---|
| EP | 1 168 465 | 1/2002 |
| JP | 06-290983 | 10/1994 |

(Continued)

OTHER PUBLICATIONS

JP 2006_303519_MT, Feb. 11, 2006.*

(Continued)

*Primary Examiner* — Vera Katz
(74) *Attorney, Agent, or Firm* — Cozen O'Connor

(57) ABSTRACT

In order to obtain a ferroelectric thin film having good crystallinity and realizing high piezoelectric properties, and a production method therefor, provided is a ferroelectric thin film constituting a dielectric material having a perovskite structure that comprises Zr and Ti formed on a substrate, wherein a layer having a Zr ratio that is smaller than a predetermined ratio and having good crystallinity and a layer that realizes good piezoelectric properties and has a Zr ratio that is about as great as the predetermined ratio are combined. A production method is also provided.

16 Claims, 9 Drawing Sheets

(51) Int. Cl.
    *C23C 14/35*      (2006.01)
    *H01L 21/02*      (2006.01)

(56) References Cited

U.S. PATENT DOCUMENTS

| 2011/0081137 | A1* | 4/2011 | Masuda | 392/416 |
|---|---|---|---|---|
| 2011/0098173 | A1 | 4/2011 | Fujii et al. | |
| 2015/0084486 | A1* | 3/2015 | Eguchi | 310/360 |

FOREIGN PATENT DOCUMENTS

| JP | 2002-009358 | 1/2002 |
|---|---|---|
| JP | 2004-063750 | 2/2004 |
| JP | 2005-322941 | 11/2005 |
| JP | 2006-303519 | 11/2006 |
| JP | 2007-042984 | 2/2007 |
| JP | 2007-335779 | 12/2007 |
| JP | 2008-4781 | 1/2008 |
| JP | 2010-214800 | 9/2010 |
| JP | 2010-219079 | 9/2010 |

OTHER PUBLICATIONS

JP 2005_322941_MT Nov. 17, 2005.*
Kim et al. Applied Physics Letters, 88, 262907, 2006, 1-3.*
Wasa, K. et al., "Effects of PLT-Buffer Layer on Microstructures of Sputtered PLZT Thin Films Epitaxially Grown on Sapphire", Journal of Materials Research, vol. 9, No. 11, Nov. 1994, pp. 2959-2967.
G.H. Haertling, "Ferroelectric Ceramics: History and Technology", J. Am. Ceramic Soc., vol. 82, No. 4, pp. 797-818, 1999.
Office Action dated Mar. 3, 2015 which issued in the corresponding Japanese Patent Application No. 2013-504613.

* cited by examiner

ABO₃ PEROVSKITE STRUCTURE

FIG.9

PIEZOELECTRIC PROPERTIES OF PLZT

| Composition | Density (g/cm³) | Tc (°C) | K | tan δ (%) | Kp | K33 | d33 (×10⁻¹² C/N) | d31 (×10⁻¹² C/N) |
|---|---|---|---|---|---|---|---|---|
| BaTiO₃ | 5.7 | 115 | 1700 | 0.5 | 0.36 | 0.5 | 190 | -78 |
| PZT-4 | 7.5 | 328 | 1300 | 0.4 | 0.58 | 0.7 | 289 | -123 |
| PZT-5A | 7.8 | 365 | 1700 | 2.0 | 0.6 | 0.71 | 374 | -171 |
| PZT-5H | 7.5 | 193 | 3400 | 4.0 | 0.65 | 0.75 | 593 | -274 |
| PMN-PT(65/35) | 7.6 | 185 | 3640 |  | 0.58 | 0.70 | 563 | -241 |
| PMN-PT(90/10) | 7.6 | 40 | 24000 | 5.5 | 0 | 0 | 0 | 0 |
| PbNb₂O₆ | 6.0 | 570 | 225 | 1.0 | 0.07 | 0.38 | 85 | -9 |
| (Na₀.₅K₀.₅)NbO₃ | 4.5 | 420 | 496 | 1.4 | 0.46 | 0.61 | 127 | -51 |
| PLZT 7/60/40 | 7.8 | 160 | 2590 | 1.9 | 0.72 |  | 710 | -262 |
| PLZT 8/40/60 | 7.8 | 245 | 980 | 1.2 | 0.34 |  |  |  |
| PLZT 12/40/60 | 7.7 | 145 | 1300 | 1.3 | 0.47 |  | 235 |  |
| PLZT 7/65/35 | 7.8 | 150 | 1850 | 1.8 | 0.62 |  | 400 |  |
| PLZT 8/65/35 | 7.8 | 110 | 3400 | 3.0 | 0.65 |  | 682 |  |
| PLZT 9/65/35 | 7.8 | 80 | 5700 | 6.0 | 0 | 0 | 0 | 0 |
| PLZT 9.5/65/35 | 7.8 | 75 | 5500 | 5.5 | 0 | 0 | 0 | 0 |
| PLZT 7.6/70/30 | 7.8 | 100 | 4940 | 5.4 | 0.65 |  |  |  |
| PLZT 8/70/30 | 7.8 | 85 | 5100 | 4.7 | 0 | 0 | 0 | 0 |

REFERENCE : Gene H.Heartling "Ferroelectric Ceramics: History and Technology", Journal of American Ceramic Society, 82[4]797-818(1999),Table III

FERROELECTRIC THIN FILM AND METHOD FOR PRODUCING SAME

RELATED APPLICATIONS

This is a U.S. national stage of International application No. PCT/JP2012/052805 filed on Feb. 8, 2012.

This application claims the priority of Japanese application no. 2011-056081 filed Mar. 15, 2011, the entire content of which is hereby incorporated by reference.

TECHNICAL FIELD

The present invention relates to a ferroelectric thin film and a method for producing the same and relates particularly to a ferroelectric thin film formed on a substrate and a method for producing the same.

BACKGROUND ART

Conventionally, for an electromechanical transducer for a driving device, a sensor, or the like, a piezoelectric body such as PZT (lead zirconate titanate) is used. Furthermore, in recent years, in response to demands such as for size reduction, an increased packaging density, and cost reduction of apparatuses, there has been an increased use of a MEMS (micro-electro-mechanical systems) device using a Si substrate. In order to apply a piezoelectric body to a MEMS device, it is desirable that the piezoelectric body be reduced in thickness.

By such thickness reduction, high-precision processing using a semiconductor process technology such as film formation or photolithography is enabled, and thus size reduction and an increased packaging density can be realized. Furthermore, devices can be collectively processed so as to achieve a high packaging density on a large-area wafer, and thus cost reduction can be achieved. Moreover, mechanoelectrical transduction efficiency is improved, and thus there are provided advantages such as improvements in property of a driving device and in sensitivity of a sensor.

For example, in a case of a thermal sensor, having a MEMS configuration, it is reduced in thermal conductance, so that a measurement sensitivity thereof can be increased, and in a case of an ink-jet head for a printer, nozzles thereof are provided at an increased packaging density, so that high-definition patterning can be performed.

As a method for forming a film of a piezoelectric body such as PZT on a substrate such as of Si (silicon), there are known chemical methods such as CVD, physical methods such as sputtering and ion plating, and liquid phase growth methods such as a sol-gel method. A film of PZT thus formed exhibits an excellent piezoelectric effect when crystals thereof have a perovskite structure.

A PZT film formed on an electrode on a Si substrate has, due to a difference in lattice constant from that of crystals of the electrode, a polycrystalline structure in which a plurality of crystals assemble together in the form of columns. It is known that the more of such columnar crystals are grown on the same crystal face in a film thickness direction (the higher an orientation characteristic is), the higher a piezoelectric property of the film is.

Recent years have seen a demand for a further improved property of a piezoelectric film such as of PZT. As one measure to obtain such an improved piezoelectric property, an impurity is added so that a relative dielectric constant and a piezoelectric property are improved. It is known that, particularly, $(Pb_{1-X}La_X)(Zr_YTi_{1-Y})_{1-X/4}O_3$ (hereinafter, referred to as PLZT), a substance obtained by substituting Pb located at an A site in a piezoelectric body having a perovskite structure (which is ideally a crystalline structure having a unit cell of a cubic system and composed of a metal A located at each vertex of a cubic crystal, a metal B located at a body center, and oxygen O located at each face center of the cubic crystal, and encompasses distorted cubic crystals such as a tetragonal crystal, an orthorhombic crystal, and a rhombohedral crystal) with La (lanthanum) that is an element having a valence number one number higher than that of Pb has a high relative dielectric constant and a high piezoelectric constant.

For example, a non-patent document 1 discloses that, in PLZT in the form of bulk ceramics, with a predetermined La added amount (for example, 8%) and a Zr/Ti ratio of 60/40 therein, a high piezoelectric property is obtained.

In a case, however, where an attempt is made to obtain a thin film of PLZT by film formation, resulting PLZT in the form of a thin film is poorer in crystallinity as compared with PZT and does not provide such a high property as is obtained when in the form of bulk ceramics.

As a solution to this, a patent document 1 discloses a technique in which a PLT layer free of Zr is formed, and a PLZT layer is formed on the PLT layer. In this technique, by using the PLT layer having good crystallinity as an undercoating layer, crystallinity of PLZT can be improved. Furthermore, a patent document 2 discloses a technique in which, in order to alleviate a lattice mismatch between a buffer layer as a base and a piezoelectric layer main body (PZT), a stepped layer composed of a plurality of layers whose compositions vary in a stepwise manner is provided between them. In this stepped layer, a ratio of Zr/Ti (molar ratio) of each of the layers constituting the stepped layer gradually decreases or increases with increasing distance from the buffer layer in a thickness direction.

LIST OF CITATIONS

Patent Literature

Patent Document 1: JP-A-H 6-290983
Patent Document 2: JP-A-2007-42984

Non-patent Literature

Non-patent Document 1: Gene H. Heartling "Ferroelectric Ceramics: History and Technology", Journal of American Ceramic Society, 82[4]797-818(1999)

SUMMARY OF THE INVENTION

Technical Problem

In the configuration described in the patent document 1, however, being originally low in piezoelectric property, PLT forming the undercoating layer is not suitable for use to improve a piezoelectric property of a piezoelectric film as a whole. Furthermore, the patent document 2 is to obtain a crystal of PZT reduced in degree of distortion by alleviating a lattice mismatch with the buffer layer and makes no reference to crystallinity of PLZT.

In view of the above-described problems, it is an object of the present invention to provide a ferroelectric thin film that is a thin film of a ferroelectric body formed with good crystallinity and exhibits a high piezoelectric property, and a method for producing the ferroelectric thin film.

Solution to the Problem

In order to achieve the above-described object, the present invention provides a ferroelectric thin film that is a film of a dielectric material having a perovskite structure formed on a base body. The dielectric material is made of a composite oxide obtained by adding, as an additive, a metal material other than Pb, Zr, and Ti to PZT. The thin film includes layers different in Zr/Ti ratio, which are a first layer that has a small compounding percentage of Zr and is formed on the base body and a second layer that has a large compounding percentage of Zr and is formed on the first layer.

According to this configuration, even in a case of using a dielectric material that varies in level of crystallinity and in piezoelectric property depending on a compounding concentration of an additive, the following is achieved. That is, since a compounding percentage of Zr smaller than a predetermined percentage provides excellent crystallinity and a compounding percentage of Zr as large as the predetermined percentage allows an excellent piezoelectric property to be exhibited, by forming, in combination, a first layer having such a compounding percentage that excellent crystallinity is obtained and a second layer having such a compounding percentage that a high piezoelectric property is obtained, a ferroelectric thin film of a predetermined thickness that exhibits a predetermined piezoelectric property can be formed with good crystallinity. That is, it is possible to obtain a ferroelectric thin film that is a thin film of a ferroelectric body formed with good crystallinity on a base body obtained by forming a lower electrode layer on a substrate, and exhibits a high piezoelectric property.

Furthermore, the present invention provides a method for producing the ferroelectric thin film configured as above, which includes a piezoelectric film formation step that uses a sputtering-type film forming apparatus that forms a film on a base body by using a dielectric material as a target material and in which, as the target material, target materials having different predetermined values of a Zr/Ti ratio are used to form the first layer on the base body and the second layer on said first layer.

According to this configuration, film formation is performed by using a target material having such a Zr/Ti ratio that excellent crystallinity is obtained and a target material having such a Zr/Ti ratio that an excellent piezoelectric property is obtained, and thus a film that exhibits a predetermined piezoelectric property can be formed to a predetermined thickness without deterioration in crystallinity, so that it is possible to obtain a method for producing a ferroelectric thin film that is a thin film of a ferroelectric body of a predetermined thickness formed with good crystallinity on a substrate and exhibits a high piezoelectric property.

Advantageous Effects of the Invention

According to the present invention, it is possible to obtain a ferroelectric thin film that is a thin film of a ferroelectric body formed with good crystallinity and exhibits a high piezoelectric property, and a method for producing the same.

BRIEF DESCRIPTION OF DRAWINGS

[FIG. 9] is a table showing piezoelectric properties of PLZT.

DESCRIPTION OF EMBODIMENTS

Hereinafter, an embodiment of the present invention will be described with reference to the appended drawings. Furthermore, in the following, like constituent members are denoted by like reference symbols, and detailed descriptions thereof are omitted where appropriate.

Figure 1:
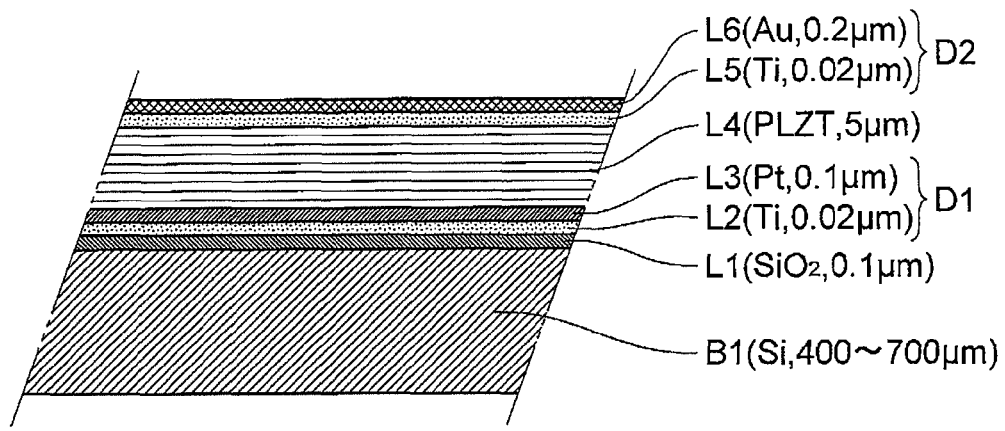
[FIG. 1] is a sectional view showing a layer configuration of a piezoelectric device including a ferroelectric thin film according to the present invention.

With reference to FIG. 1, a description is given of a ferroelectric thin film according to this embodiment. FIG. 1 is a sectional schematic view showing a layer configuration of a piezoelectric device including a ferroelectric thin film L4, in which a silicon substrate B1 is used as a substrate, and thereon, a thermally oxidized film ($SiO_2$ layer) L1, a Ti film L2, a Pt film L3, the ferroelectric thin film L4, a Ti film L5, and an Au film L6 are formed in this order.

The substrate B1 has a thickness that varies depending on a substrate size (diameter) and is, for example, about 400 to 700 μm. For the purposes of protection and insulation of the substrate B1, the thermally oxidized film L1 is formed by heating the substrate B1 at about 800 to 1300° C. in an oxygen atmosphere and has a thickness of, for example, about 0.1 μm.

The Ti film L2 and the Pt film L3 are formed in this order by sputtering on the thermally oxidized film L1 and together constitute a lower electrode layer D1. Ti is intended to improve adhesion between $SiO_2$ and Pt and has a film thickness of, for example, about 0.02 μm. Furthermore, Pt has a thickness of, for example, about 0.1 μm. Materials of the lower electrode layer D1 are not limited to the above, and, for example, Ir may be used in place of Pt.

The ferroelectric thin film L4 is made of PLZT having a perovskite structure including Zr and Ti. The ferroelectric thin film L4 is formed by sputtering on the lower electrode layer D1 and has a thickness that varies depending on an intended use thereof and is, preferably, for example, not more than 1 μm for a sensor or a filter and about 3 to 5 μm for an actuator. For this reason, in this embodiment in which an intended application is a driving device for a MEMS actuator, the ferroelectric thin film L4 is set to be 4 to 5 μm thick. A method for forming the ferroelectric thin film L4 will be described later in more detail.

Subsequently, on the ferroelectric thin film L4, the Ti film L5 and the Au film L6 are formed in this order by sputtering to form an upper electrode layer D2. Ti is intended to improve adhesion between PLZT and Au and has a film thickness of, for example, about 0.02 μm. Furthermore, Au has a thickness of, for example, about 0.1 μm.

Figure 2:
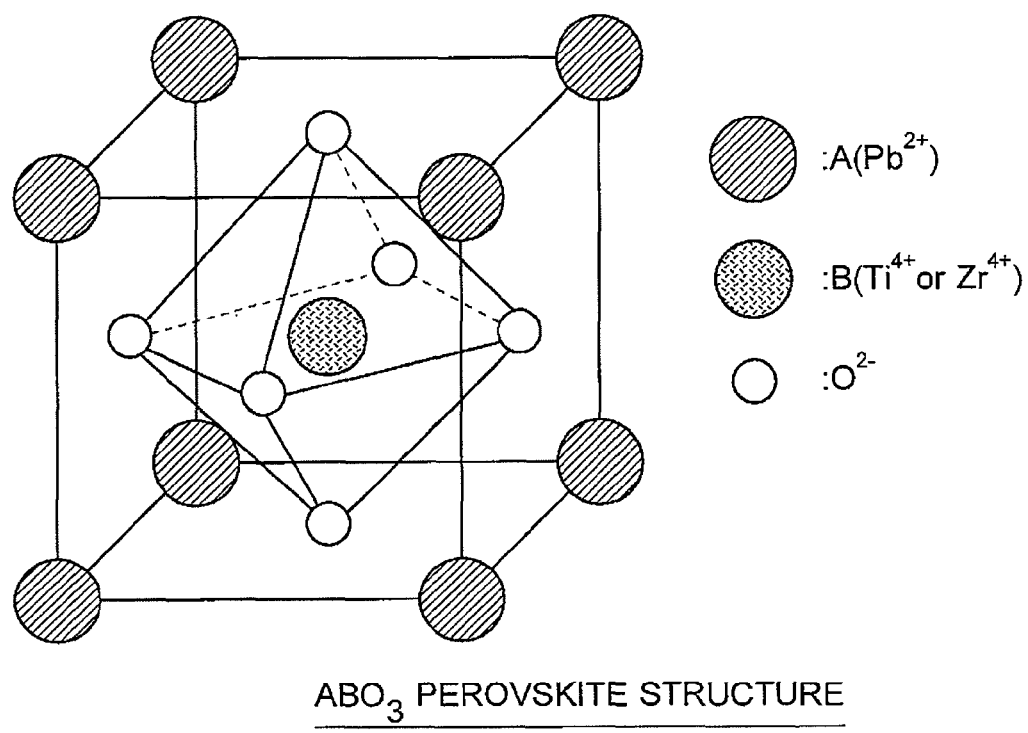
[FIG. 2] is an explanatory view schematically showing a crystalline structure of a ferroelectric body.

The ferroelectric thin film L4 is made of a composite oxide of multiple elements, such as PLZT having a perovskite structure shown in FIG. 2. In this embodiment, the ferroelectric thin film L4 is formed by using a dielectric material that is obtained by adding a predetermined amount of La (lanthanum) to PZT.

A perovskite structure is, for example, a ternary crystalline structure referred to as $ABO_3$, which is shown in the figure. Herein, PLZT, a substance obtained by substituting Pb located at an A site with La (lanthanum) that is an element having a valence number one number higher than that of Pb has a high relative dielectric constant and a high piezoelectric constant.

As described above, by adding an additive (metal material) other than Pb, Zr, and Ti constituting. PZT at a predetermined concentration to PZT used as a piezoelectric body, a high piezoelectric property is exhibited, and thus, in this embodiment, the ferroelectric thin film L4 is configured by forming a film of a dielectric material made of a composite oxide of multiple elements, which is obtained by adding La to PZT, on a base body (composed of the substrate B1 and the lower electrode layer D1 formed on the substrate B1). Furthermore, the ferroelectric thin film L4 is configured to have a compounding percentage of each of Zr and Ti (Zr/Ti ratio) varying in a thickness direction of the thin film.

This is because, when an additive is added to PZT, the smaller a compounding percentage of Zr is, the better resulting crystallinity is, so that a perovskite structure is maintained. Based on this, the ferroelectric thin film L4 is formed so as to have a compounding percentage of Zr varying in the thickness direction of the film, and thus the ferroelectric thin film L4 having a high piezoelectric property can be formed without a decrease in crystallinity.

Furthermore, since it is known that, when a film is formed on an undercoating layer, if the undercoating layer has excellent crystallinity, the film formed thereon is improved in crystallinity, preferably, an undercoating layer on which a ferroelectric thin film containing an additive at a predetermined concentration is formed has excellent crystallinity.

Figure 3:
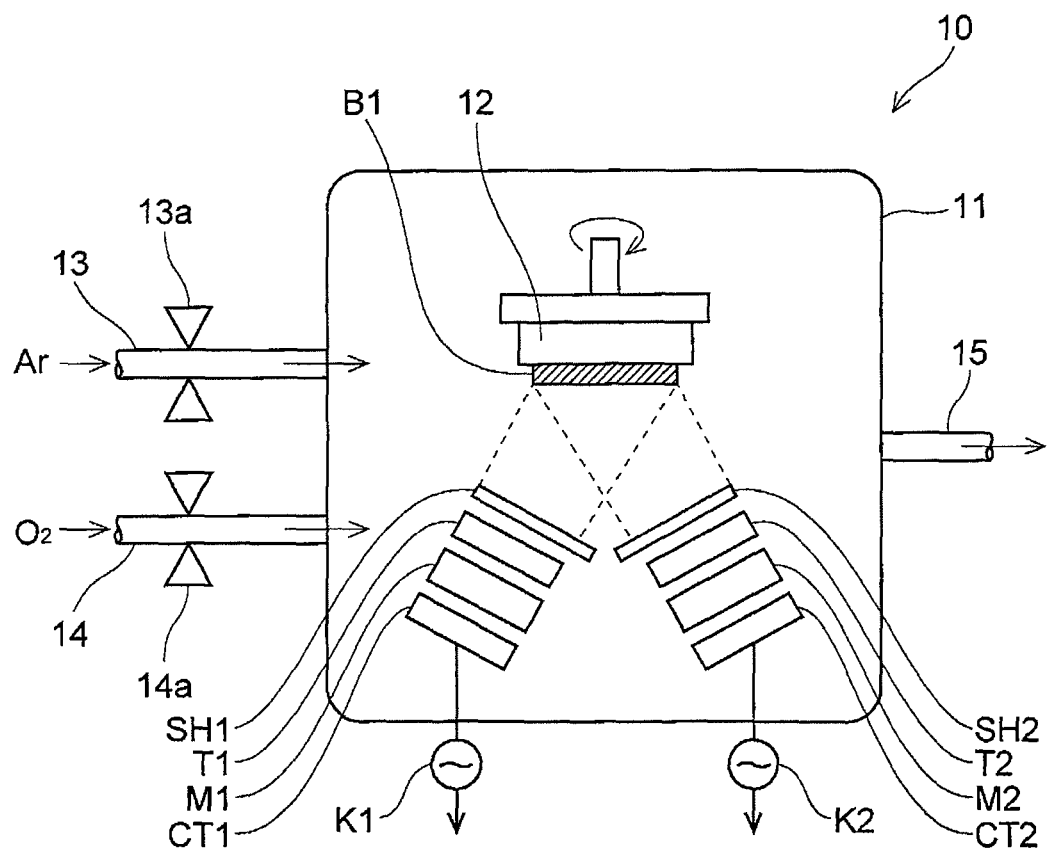
[FIG. 3] is a schematic explanatory view showing a configuration of a film forming apparatus.

Next, with reference to FIG. 3, a description is given of one example of a film forming apparatus that forms the ferroelectric thin film L4 according to this embodiment. A film forming apparatus 10 is a sputtering-type film forming apparatus, and on a substrate B1 (for example, a silicon substrate) installed in the film forming apparatus, a layer of a predetermined material is formed by high-frequency magnetron sputtering.

The film forming apparatus 10 includes, in a vacuum chamber 11, a substrate heater 12 on which the substrate B1 is installed and that heats the substrate B1, and is provided with an introduction duct 13 for introducing argon (Ar) as a sputtering gas, an introduction duct 14 for introducing oxygen, and an exhaust duct 15. T1 and T2 each denote a PLZT target made of elements Pb, La, Zr, Ti, and O, and the targets T1 and T2 have respective predetermined dielectric material ratios (for example, predetermined Zr/Ti ratios). Furthermore, each of M1 and M2 denotes a magnet, each of CT1 and CT2 denotes a cathode electrode, and each of K1 and K2 denotes a high-frequency power source.

Each of the targets T1 and T2 is manufactured in the following manner. That is, powdered materials of PLZT prepared to have a predetermined composition ratio are blended, fired, and pulverized, after which they are filled in a target tray and pressed with a pressing machine.

Then, the targets T1 and T2 are installed on the magnets M1 and M2, respectively. Furthermore, a cover may be placed on each the targets T1 and T2. The magnets M1 and M2 and the cathode electrodes CT1 and CT2 provided below them, respectively, are insulated from the vacuum chamber 11 by an insulator. Furthermore, the cathode electrodes CT1 and CT2 are connected to the high-frequency power sources K1 and K2, respectively.

Next, the substrate B1 is installed on the substrate heater 12. Then, air in the vacuum chamber 11 is exhausted therefrom, and the substrate B1 is heated to 600° C. by the substrate heater 12. After the heating, valves 13a and 14a are opened so that Ar as a sputtering gas and $O_2$ are introduced at a predetermined ratio into the vacuum chamber 11 through the introduction ducts, and a degree of vacuum is maintained at a predetermined value. From the high-frequency power sources K1 and K2, high-frequency power is supplied to the targets T1 and T2, respectively, so that plasma is generated. At this time, a film formation rate can be adjusted in accordance with a set value regarding high-frequency power, and thus by adjusting high-frequency power to be supplied to each of the targets T1 and T2, concentrations of elements in a PLZT film, namely, compounding concentrations of dielectric materials can be adjusted. Furthermore, shutters SH1 and SH2 are opened and closed independently of each other, and thus each of PLZT of the target T1 and PLZT of the target T2 can be formed as required on the substrate, i.e. on the base body.

As described above, a plurality of types of targets different in Zr/Ti ratio are mounted, and thus films originating from the targets can be formed sequentially and concurrently.

Furthermore, various studies on crystallinity of a thin film of PLZT obtained by adding La (lanthanum) to PZT have found that perovskite crystallinity thereof is poorer on a Zr-rich side and more excellent on a Ti-rich side. In this connection, with reference to FIGS. 7A to 7C, a description is given of actually measured dependence of a Zr/Ti ratio with respect to perovskite crystallinity. Herein, FIG. 7A is a graph showing dependence of a Zr/Ti ratio with respect to crystallinity of PLZT in a case where an La added amount is 7.5%, FIG. 7B is a graph showing dependence of a Zr/Ti ratio with respect to crystallinity of PLZT in a case where an La added amount is 3.3%, and FIG. 7C is a graph showing dependence of a Zr/Ti ratio with respect to crystallinity of PZT in a case where an La added amount is 0%.

Crystallinity was determined by a conventional known method in which a $(\theta-2\theta)$ measurement was performed with respect to each of thin films by using an X-ray diffractometer. Furthermore, a peak intensity representing a perovskite structure oriented in a (111) direction is normalized assuming that a value thereof at a maximum value of a $Zr/(Zr+Ti)$ ratio is 1. For the sake of comparison of the peak intensity, all the thin films are set to have a fixed film thickness (60 nm), and as for their orientations, almost no perovskite peaks other than a (111) peak are observed.

Figure 7A:
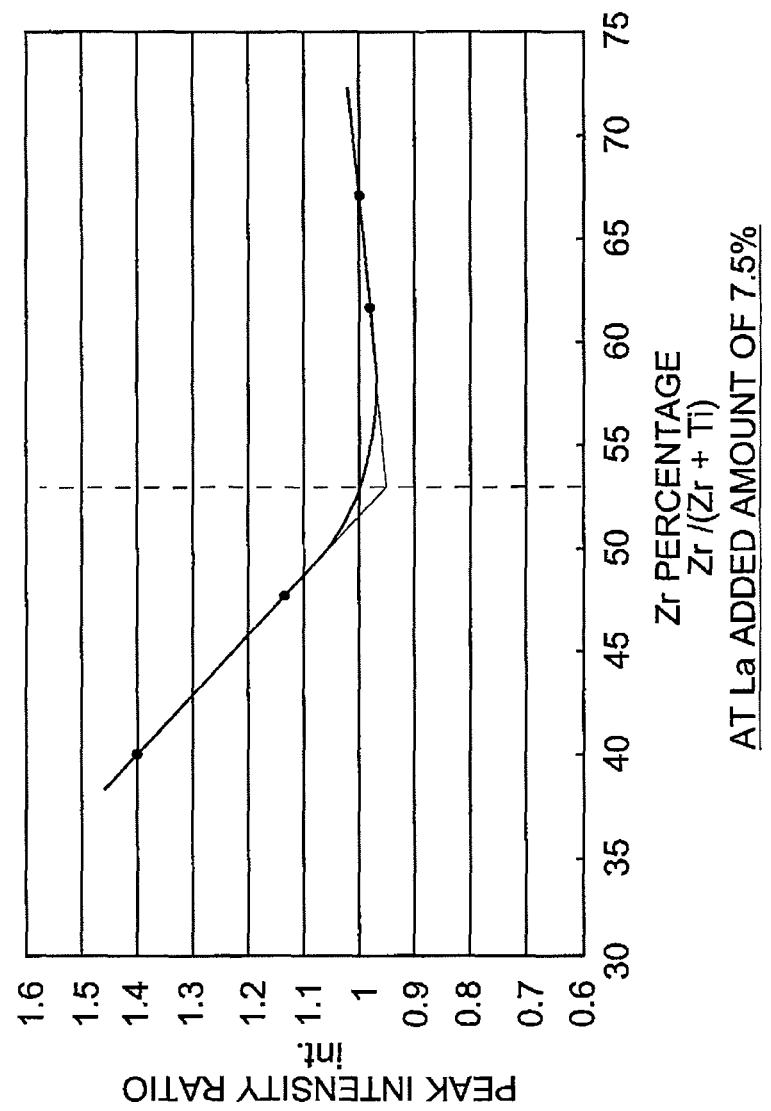
[FIG. 7A] is a graph showing dependence of a Zr/Ti ratio with respect to crystallinity of PLZT.

As is understood from FIG. 7A showing a peak intensity ratio in the case where the La added amount is 7.5%, in this case, a portion of the thin film where a Zr compounding percentage is 53% is a crystallinity level boundary portion. That is, it has been found that, with respect to a portion where the Zr/Ti ratio=53:47 as a boundary, excellent crystallinity is obtained in a region of the thin film where the Zr compounding percentage is lower than in this portion. In other words, it has been found that a region of the thin film where the Zr compounding percentage is not more than 53% is a region where excellent crystallinity is obtained.

Figure 7B:
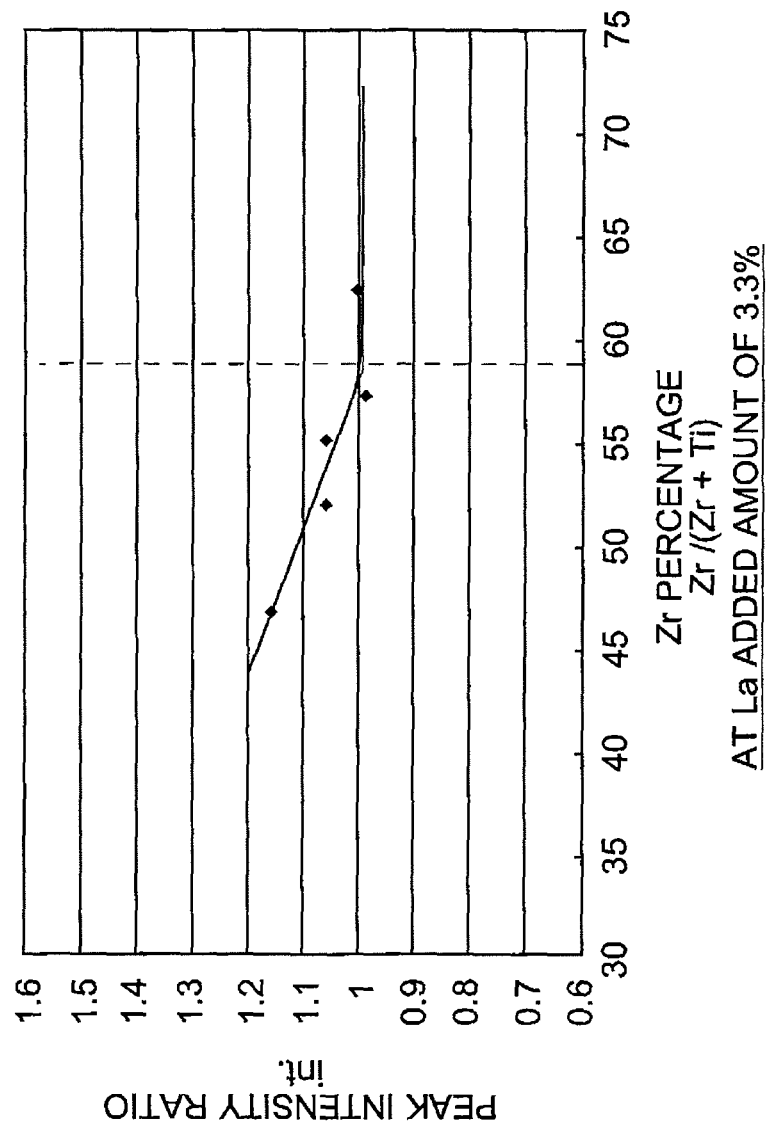
[FIG. 7B] is a graph showing dependence of a Zr/Ti ratio with respect to crystallinity of PLZT.
Figure 7C:
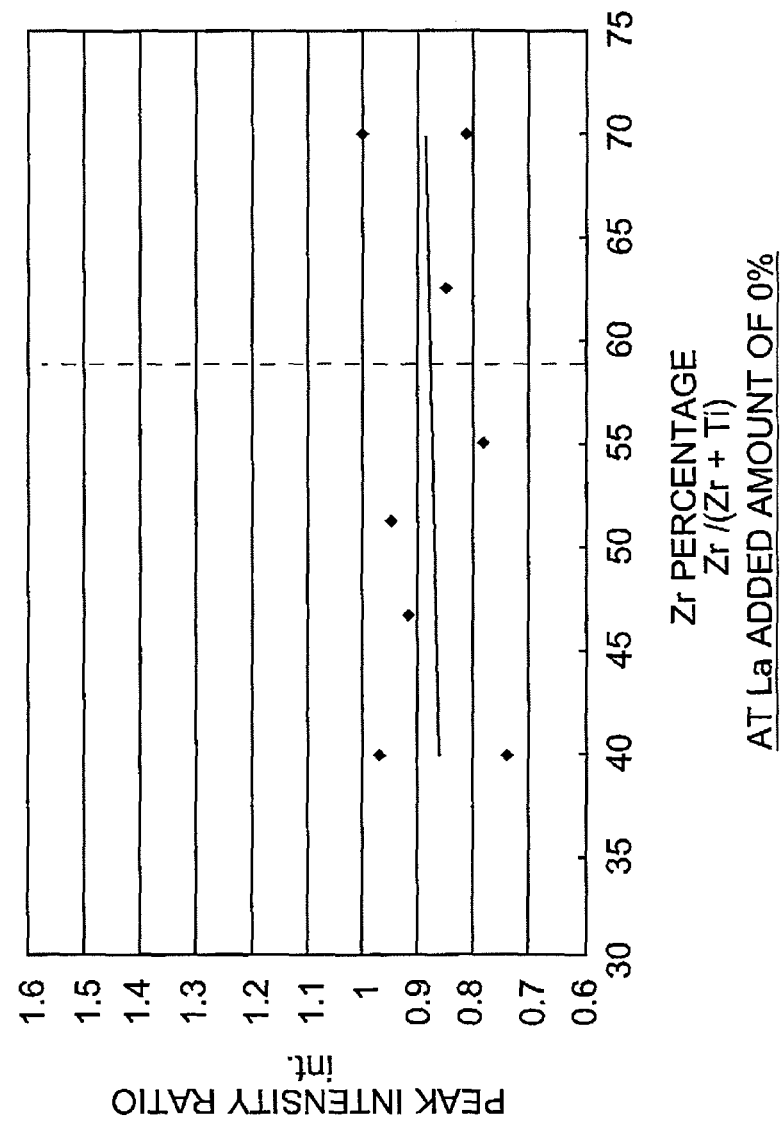
[FIG. 7C] is a graph showing dependence of a Zr/Ti ratio with respect to crystallinity of PZT.

Furthermore, in the case where the La added amount is 3.3%, it is understood from a measurement result of a peak intensity ratio shown in FIG. 7B that excellent crystallinity is obtained in a region of the thin film where a Zr compounding percentage is lower than 58 to 59%.

As described above, it has been revealed that, when La is added to PZT, there exists a predetermined first compounding ratio defining a crystallinity level boundary portion. For example, in a case where an La added amount is 7.5% at which an excellent piezoelectric property is exhibited, the first compounding ratio is a compounding ratio (Zr/Ti ratio=53:47) with a Zr compounding percentage of about 53%.

Furthermore, it is understood that in the case where the La added amount is 7.5%, the peak intensity varies to a greater degree than in the case where the La added amount is 3.3%. Hence, an increase in amount of an additive leads to an increase in influence of a Zr/Ti ratio, which necessitates a film formation step placing increased emphasis on the predetermined first compounding ratio defining a crystallinity level boundary portion. That is, it is understood that, in order to form a film of PLZT with good crystallinity, preferably, a first layer formed on the base body has a Zr compounding percentage of not more than 53% ($0 < Zr \leq 53\%$).

As described earlier, since it is known that, when formed on an undercoating layer having good crystallinity, thin films of any types are improved in crystallinity as long as they are similar in their crystalline structures, by providing a first layer having excellent perovskite crystallinity, it becomes possible to easily form a second layer that exhibits an excellent piezoelectric property, so that there can be formed a ferroelectric thin film that, as a whole, exhibits a predetermined piezoelectric property.

In the case where the La added amount is 0%, which is shown in FIG. 7C, no variation occurs in peak intensity of crystallinity. Thus, in PZT with no La added thereto, making a compounding percentage of Zr vary also allows substantially similar crystallinity to be obtained. When, however, an additive is added in order to obtain an improved piezoelectric property, preferably, a first layer having a Zr compounding percentage lower than the predetermined first compounding ratio defining a crystallinity level boundary portion is provided, and a second layer having such a Zr compounding percentage that an excellent piezoelectric property is exhibited is formed thereon. Thus, preferably, on a first layer having a small compounding percentage of Zr, a second layer having a large compounding percentage of Zr is stacked.

In a case of PLZT, a value of a Zr/Ti ratio representing a MPB (morphotropic phase boundary) composition providing a high piezoelectric property is generally larger than 52% and up to a maximum of around 65%. Furthermore, an increase in Zr/Ti ratio (an increase in compounding percentage of Zr) might lead to deterioration in crystallinity. According to this embodiment, however, a ferroelectric thin film having a high piezoelectric property can be stably formed without deterioration in crystallinity.

Since, with the Zr/Ti ratio having such a value that a high piezoelectric property is obtained, Zr is contained at about 65% at the maximum, preferably, in forming the second layer that exhibits an excellent piezoelectric property, the second layer is set to have a compounding ratio of Zr of about 60 to 65%. That is, preferably, there is used a target manufactured at a predetermined second compounding ratio with such a large compounding percentage of Zr that a predetermined piezoelectric property is exhibited.

For this reason, this embodiment adopts a method for producing a ferroelectric thin film, which includes a piezoelectric film formation step in which, in the aforementioned film forming apparatus 10, as PLZT target materials, there are used a target material having such a small Zr compounding percentage that excellent crystallinity is obtained and a target material having such a large Zr compounding percentage that a predetermined piezoelectric property is exhibited, namely, target materials having different predetermined values of a Zr/Ti ratio, and on a first layer having a small compounding percentage of Zr, a second layer having a large compounding percentage of Zr is stacked.

For example, a first PZT target having a Zr compounding percentage of 50% (a Zr/Ti ratio of 50:50) and a second PZT target having a Zr compounding percentage of 60% (a Zr/Ti ratio of 60:40) are prepared and installed on the magnets, respectively. Furthermore, with respect to the first and second PZT targets, the aforementioned cathode electrodes and the high-frequency power sources are installed, respectively. Then, from the high-frequency power sources, high-frequency power is supplied to the predetermined targets, respectively, so that films are formed. By controlling an input value or an input time period regarding the high-frequency power, i.e. by adjusting a film formation rate in accordance with a set value regarding the high-frequency power, each of the films can be formed as required to a predetermined thickness on the substrate.

EXAMPLE 1

Figure 4:
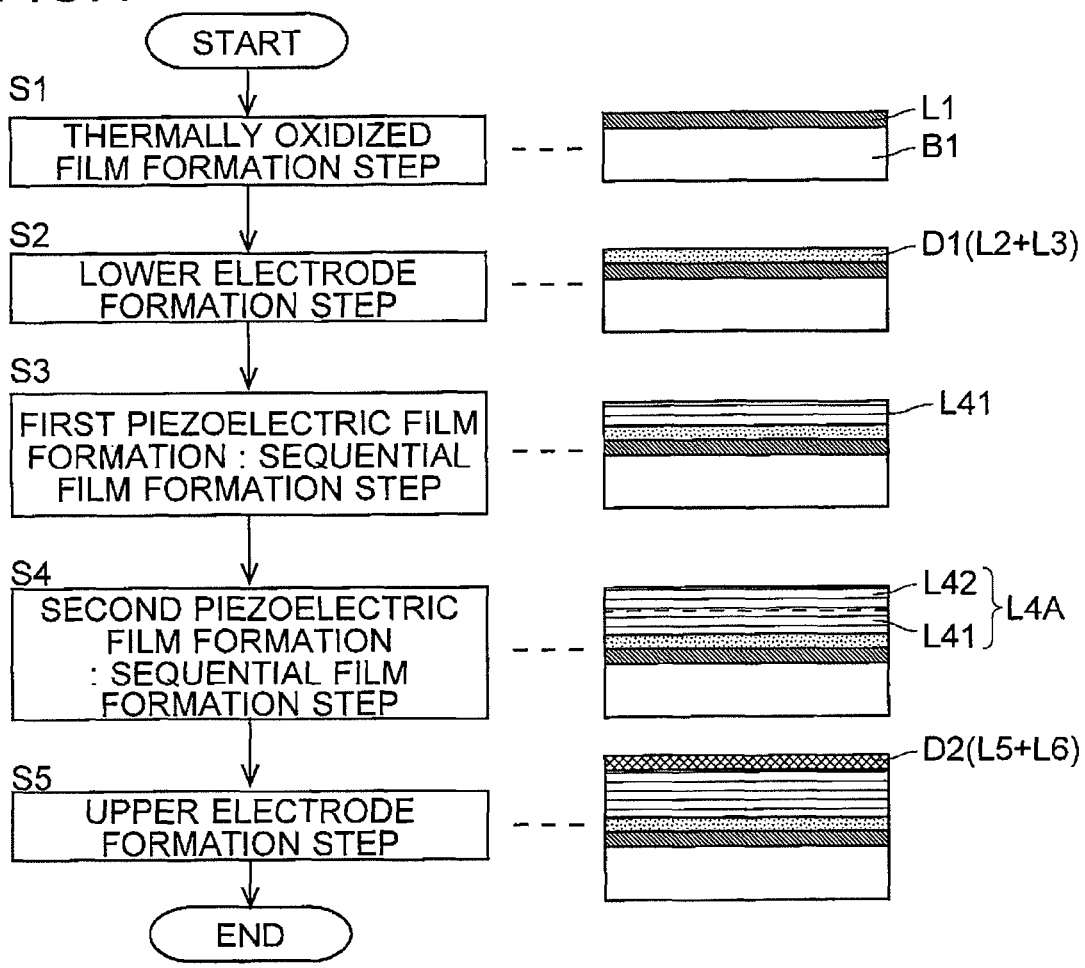
[FIG. 4] is an explanatory view showing a film formation flow having a sequential film formation step together with sectional views corresponding to respective production steps.

FIG. 4 shows a film formation flow of Example 1. In Example 1, by using a silicon substrate as a substrate and La as an additive, there is formed a thin film of PLZT that is a composite oxide obtained by adding La to PZT. Furthermore, the film formation flow includes a piezoelectric film formation step in which, by using two types of PLZT targets different in Zr compounding percentage, a first layer having a small compounding percentage of Zr and a second layer having a large compounding percentage of Zr are stacked on each other in a layer stacking direction.

That is, the piezoelectric film formation step in Example 1 is a sequential film formation step, and this film formation flow is a first film formation flow representing a method for producing a ferroelectric thin film including a piezoelectric film of PLZT obtained by adding La to PZT.

As shown in FIG. 4, upon a start of a film formation process of Example 1, first, a thermally oxidized film formation step S1 of forming a thermally oxidized film on the silicon substrate is executed, followed by execution of a lower electrode formation step S2 of forming a lower electrode layer D1 on the thermally oxidized film L1, after which a sequential film formation step is executed in which first piezoelectric film formation S3 of forming a first PLZT layer 41 (first layer) by using a first PLZT target having a small compounding percentage of Zr and second piezoelectric film formation S4 of forming a second PLZT layer 42 (second layer) by using a second PLZT target having a large compounding percentage of Zr are performed. After the first PLZT layer 41 and the second PLZT layer 42 are stacked on each other in this order to form a piezoelectric film (ferroelectric thin film L4A) of a predetermined film thickness, an upper electrode formation step S5 of forming an upper electrode layer D2 is performed.

On a monocrystalline Si wafer having a thickness of about 400 μm, a thermally oxidized film was formed to be 100 nm thick, and on this thermally oxidized film, a Ti adhesive layer (L2 layer) having a thickness of about 20 nm was formed, on which a Pt electrode layer (L3 layer) further was formed to be about 100 nm thick. Herein, as a material of the adhesive layer, TiOx may be used instead of Ti. The use of TiOx can prevent a phenomenon in which, when exposed to a high temperature at a later step, for example, at the step of forming a PLZT thin film, the material is diffused into the Pt film to cause hillocks, and can further prevent failures of a piezoelectric thin film such as a leakage current and deterioration in orientation characteristic.

This Si wafer with Pt (base body) is installed in the earlier described film forming apparatus 10, and the film formation step is executed under predetermined conditions. Furthermore, respective composition ratios of the targets are set so that, when films originating therefrom are formed on the base body, the film formed by using the first PLZT target has a composition of $(Pb_{1-X}La_X)(Zr_YTi_{1-Y})_{1-X/4}O_3$ X=0.075 (7.5%), y=0.5 (50%)), and the film formed by using the second PLZT target has a composition of $(Pb_{1-X}La_X)(Zr_YTi_{1-Y})_{1-X/4}O_3$ (X=0.075 (7.5%), y=0.6 (60%)).

That is, the first layer formed on the base body is formed by using the first PLZT target having a compounding percentage of Zr smaller than the first compounding ratio defining a crystallinity level boundary portion, and the second layer formed on this first layer is formed by using the second PLZT target that has the second compounding ratio with such a large compounding percentage of Zr that a predetermined piezoelectric property is exhibited. Furthermore, it is likely that re-evaporation of Pb occurs at the time of high-temperature film formation, resulting in the formation of a thin film lacking in Pb. For this reason, preferably, a Pb content in a target depending on a film formation temperature is set to be increased by 10 to 30% with respect to (1-X).

Then, in the film forming apparatus, the first PLZT layer 41 was formed to be 50 nm (0.05 μm) thick, and subsequently, the second PLZT layer 42 was formed to be 4 μm thick. A thin film thus formed was examined by using an X-ray diffractometer, and as a result, it was confirmed that there was obtained a PLZT thin film composed only of a perovskite layer and oriented mainly in the direction of (111), thus having good crystallinity. By changing film quality of the Pt layer or PLZT film formation conditions, it is also possible to form this PLZT thin film so that it is oriented mainly in a direction of (100).

Figure 5:
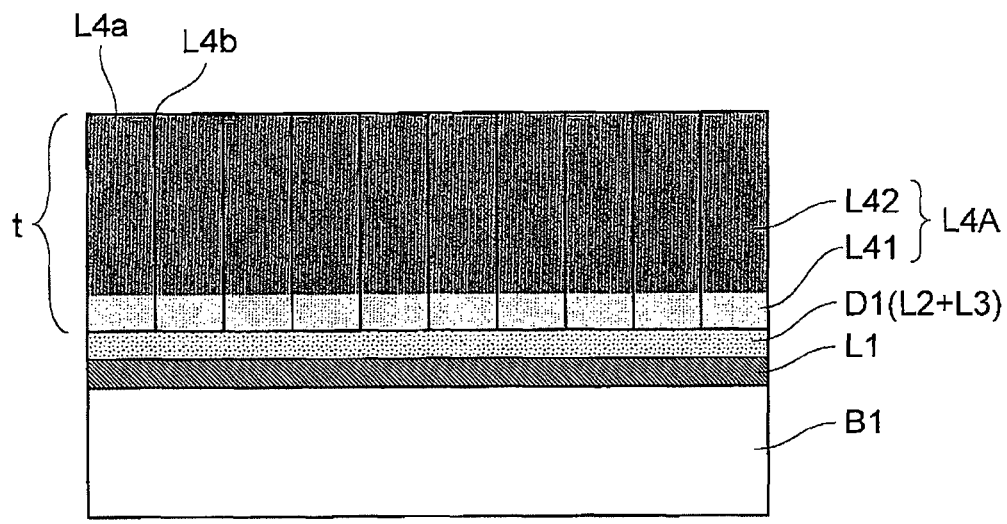
[FIG. 5] is a sectional view showing a crystalline state of a piezoelectric film obtained by the film formation flow shown in FIG. 4.

With reference to FIG. 5, a description is given of a configuration of layers of a piezoelectric film (ferroelectric thin film) obtained by the above-described film formation process. As shown in the figure, the piezoelectric film (ferroelectric thin film L4A) formed on the lower electrode layer D1 formed at the substrate B1 is obtained by forming the second PLZT layer 42 (second layer) on the first PLZT layer 41 (first layer). Furthermore, since the second layer is crystallized on the first layer having excellent crystallinity, a polycrystalline state is brought about in which a plurality of crystal grains L4a assemble together in the form of columns, forming a structure in which small columnar crystals perpendicularly extending from the substrate and having a good orientation characteristic are arranged in a concentrated manner. A crystal grain boundary L4b is formed between every adjacent ones of the crystal grains L4a.

As described above, this film is a PLZT film having a compounding percentage of Zr varying in a thickness direction thereof as shown by different shading. In this case, preferably, a Zr compounding percentage in the vicinity of the surface of the film is small (not more than the aforementioned first compounding ratio) so that high crystallinity is exhibited, and it is therefore appropriate that the Zr compounding percentage be not more than 53% (0 to 53%) and preferably about 40 to 50% (50% in this embodiment). It has been revealed that, with this configuration adopted, a PLZT initial layer in the vicinity of a lower electrode is a perovskite single-phase film having good crystallinity, which has a composition ratio substantially equivalent to a composition of a target, and thus a PLZT film formed thereon so as to have an increased compounding percentage (60% in this embodiment) of Zr is crystallized in an excellent manner without deterioration in crystallinity, so that a piezoelectric film (ferroelectric thin film L4A) can be obtained that maintains an excellent piezoelectric property and exhibits a predetermined piezoelectric property even when it has a thickness t of not less than 4 μm.

According to the above-described method for producing a ferroelectric thin film, on a first layer having such a small Zr compounding percentage that excellent crystallinity is obtained, a piezoelectric film having a large Zr compounding percentage and thus exhibiting a predetermined piezoelectric property is stacked, so that there can be formed a ferroelectric thin film of a predetermined thickness that, as a whole, exhibits a predetermined piezoelectric property.

EXAMPLE 2

Figure 6:
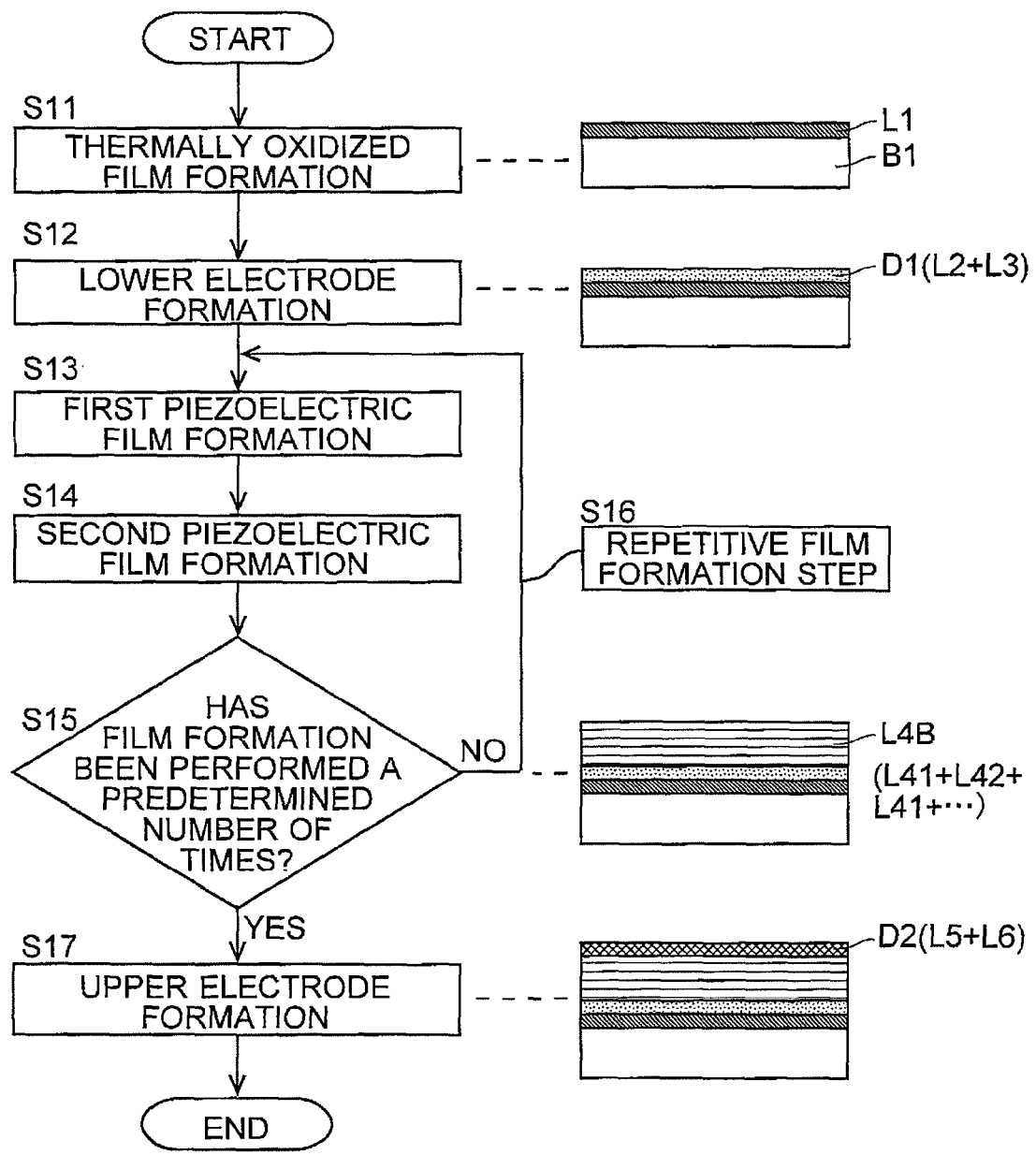
[FIG. 6] is an explanatory view showing a film formation flow having a repetitive film formation step together with sectional views corresponding to respective production steps.

FIG. 6 shows a film formation flow of Example 2. In Example 2, by using a silicon substrate as a substrate and La as an additive, there is formed a thin film of PLZT that is a composite oxide obtained by adding La to PZT. Furthermore, similarly to Example 1, the film formation flow includes a piezoelectric film formation step in which, by using two types of PLZT targets different in Zr compounding percentage, a first layer having a small compounding percentage of Zr and a second layer having a large compounding percentage of Zr are stacked on each other in a layer stacking direction. Example 2 is different from Example 1, however, in that the piezoelectric film formation step of this embodiment is not a sequential film formation step but a repetitive film formation step.

That is, in this embodiment, the first layer having a small compounding percentage of Zr and the second layer having a large compounding percentage of Zr are alternately and repetitively formed. In other words, the piezoelectric film formation step in Example 2 is a repetitive film formation step, and this film formation flow is a second film formation flow representing the method for producing a ferroelectric thin film including a piezoelectric film of PLZT obtained by adding La to PZT.

As shown in FIG. 6, upon a start of a film formation process of Example 2, first, a thermally oxidized film formation step S11 of forming a thermally oxidized film on the silicon substrate is executed, followed by execution of a lower electrode formation step S12 of forming a lower electrode layer D1 on the thermally oxidized film L1, after which first piezoelectric film formation S13 of forming a first PLZT layer 41 (first layer) by using a first PLZT target having a small compounding percentage of Zr and second piezoelectric film formation S14 of forming a second PLZT layer 42 (second layer) by using a second PLZT target having a large compounding percentage of Zr are performed. Moreover, a repetitive film formation step S16 of sequentially and repetitively performing these steps S13 and S14 is executed a preset predetermined number of times. In this manner, the first PLZT layer 41 and the second PLZT layer 42 are repetitively and alternately formed to form a piezoelectric film (ferroelectric thin film L4B) of a predetermined film thickness, after which an upper electrode formation step S17 of forming an upper electrode layer D2 is performed.

As described above, the piezoelectric film formation step adopted in Example 2 is the repetitive film formation step S16 in which film formation is performed by alternately and repetitively performing the first piezoelectric film formation step S13 of forming the first layer having a small compounding percentage of Zr and the second piezoelectric film formation step S14 of forming the second layer having a large compounding percentage of Zr. Furthermore, by adjusting the number of times this film formation is repetitively performed, a thickness of a piezoelectric film to be formed can be adjusted. At a repetition time number detection step S15 of detecting that the film formation has been repetitively performed a predetermined number of times, it is detected that the predetermined number of times of repetition has been reached, after which an upper electrode formation step S17 is executed.

For example, the first PLZT layer 41 is formed to be 50 nm (0.05 μm) thick, and then the second PLZT layer 42 is formed to be 1 μm thick. Thereafter, again, the first PLZT layer 41 is formed to be 50 nm (0.05 μm) thick, and then the second PLZT layer 42 is formed to be 1 μm thick. In this manner, the first PLZT layer 41 and the second PLZT layer 42 are sequentially and repetitively formed to be stacked on each other, and thus the ferroelectric thin film L4B of a predetermined thickness is produced.

That is, the ferroelectric thin film L4B has, on the second layer formed on the first layer, a stacked layer structure equivalent to a stacked layer structure composed of the first layer and the second layer.

Also by the ferroelectric thin film L4B produced in this manner, the following is achieved. That is, by forming, in combination, a first layer having a compounding percentage of Zr smaller than a predetermined percentage and thus having excellent crystallinity and a second layer having a compounding percentage of Zr as large as the predetermined percentage and thus exhibiting an excellent piezoelectric property, a ferroelectric thin film of a predetermined thickness that exhibits a predetermined piezoelectric property can be formed with good crystallinity.

With this configuration adopted, before a PLZT film having a large compounding percentage of Zr grows in film thickness to such an extent that crystallinity of a film is decreased, there is again provided an effect by an undercoating layer that is a PLZT layer having a small compounding percentage of Zr and thus having good crystallinity, so that a piezoelectric film (ferroelectric thin film) is formed so as to achieve a good orientation characterisitc and good crystallinity of a PLZT film. That is, according to this embodiment, it is possible to obtain the ferroelectric thin film L4B that is a thin film of a ferroelectric body of a predetermined thickness formed with good crystallinity on a base body and exhibits a high piezoelectric property, and a method for producing the same.

Furthermore, the ferroelectric thin film L4A of Example 1 and the ferroelectric thin film L4B of Example 2 are both formed to be able to exhibit a high piezoelectric property by addition of La thereto. In this case, La is contained preferably at such a compounding concentration that PLZT exhibits a high piezoelectric property, and thus, in this embodiment, an La compounding concentration is set to 7 to 8%.

Also in a case of adding an additive such as La, since a first layer formed on a base body preferably has such a compounding concentration of the additive that excellent crystallinity is obtained, preferably, layers different in compounding concentration of the additive are stacked on each other toward a thickness direction of a thin film so that a small additive compounding concentration providing excellent crystallinity and a large additive compounding concentration providing a high piezoelectric property are used in combination. As a method for forming a film so that a compounding concentration of an additive such as La therein varies, for example, as targets to be installed in the aforementioned film forming apparatus 10, there are used a PZT target manufactured at a predetermined compounding ratio and a target containing La (for example, a target made of lanthanum oxide ($La_2O_3$)), and a film formation rate for each of the targets is adjusted so that an La compounding concentration and a film thickness can be controlled.

Furthermore, with the above-described configuration, it also is easy to set layers equal in Zr/Ti ratio to be different in additive concentration, and thus film formation can be performed in such a manner that a combination of a Zr/Ti ratio and a compounding concentration of an additive is suitably selected depending on whether a layer to be formed is required to have excellent crystallinity or an excellent piezoelectric property.

As described above, even in a case of using a dielectric material that varies in level of crystallinity and in piezoelectric property depending on a compounding concentration of an additive, by using, in combination, a compounding concentration providing excellent crystallinity and a compounding concentration providing a high piezoelectric property, it is possible to obtain a ferroelectric thin film that exhibits a predetermined piezoelectric property and is formed to a predetermined thickness without deterioration in crystallinity.

Furthermore, preferably, a compounding concentration of La is not more than 8%. The reason for setting an upper limit concentration of La to 8% is that, as indicated by piezoelectric properties of PLZT (FIG. 9 shows a main part thereof) shown in Table III of the aforementioned non-patent document 1 "Gene H. Heartling 'Ferroelectric Ceramics: History and Technology', Journal of American Ceramic Society, 82[4] 797-818(1999)", PLZT 8/65/35 having a compounding concentration of 8% has a piezoelectric strain constant ($d_{33}$) of $682 \times 10^{-12}$ C/N, and PLZT 9/65/35 having a compounding concentration of 9% has a piezoelectric strain constant ($d_{33}$) of 0 C/N, which explains that 8% is appropriate as an upper limit concentration value.

<Regarding Application Example of Piezoelectric Device>

Figure 8A:
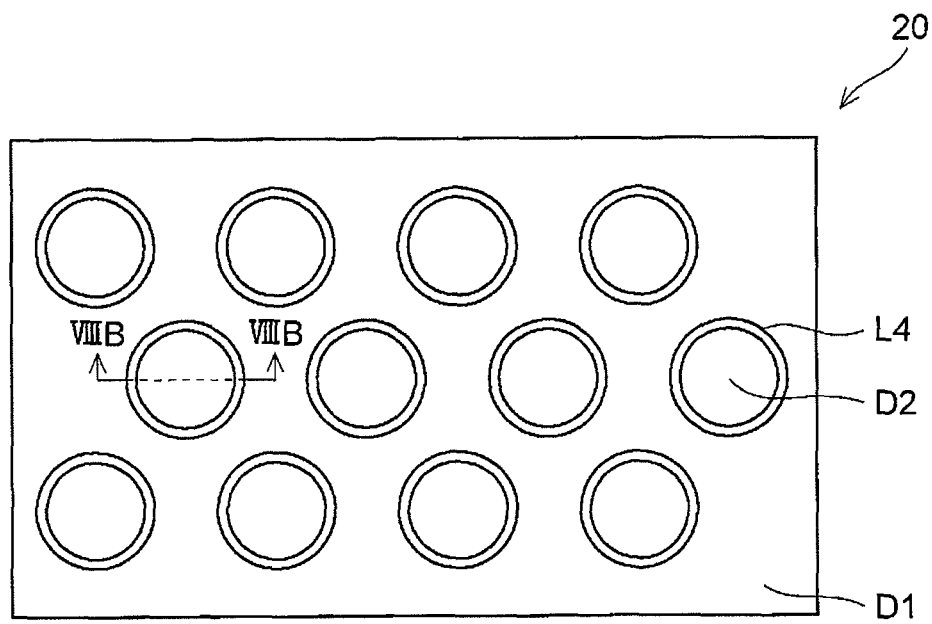
[FIG. 8A] is a plan view showing a configuration in which the above-described piezoelectric device is applied to a diaphragm.
Figure 8B:
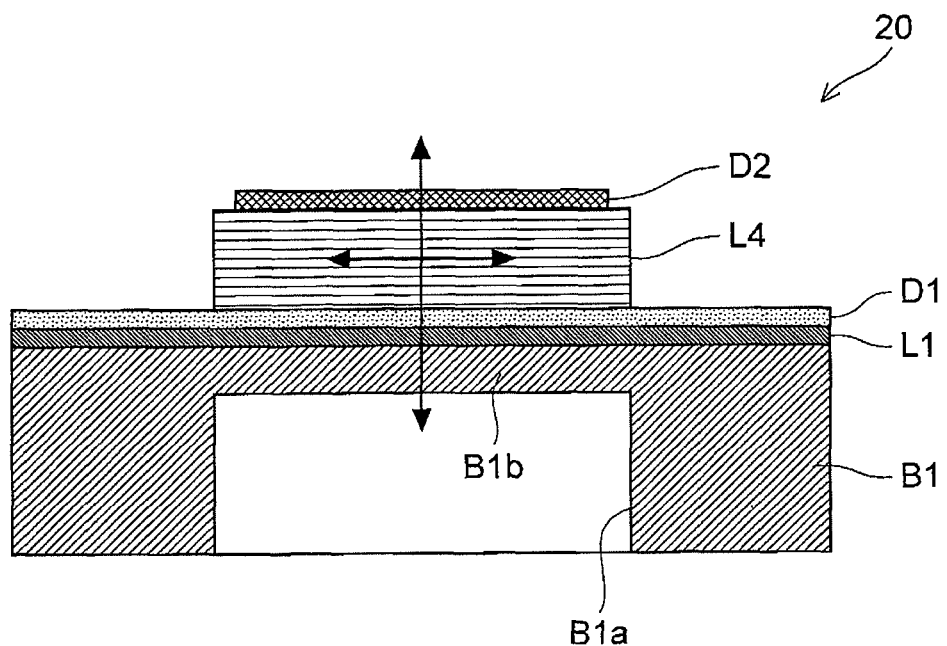
[FIG. 8B] is a sectional view taken along a line VIIIB-VIIIB of FIG. 8A.

FIG. 8A is a plan view showing a configuration in which a piezoelectric device 20 including a ferroelectric thin film manufactured in this embodiment is applied to a diaphragm (vibration plate), and FIG. 8B is a sectional view taken along a line VIIIB-VIIIB of FIG. 8A. A ferroelectric thin film L4 (piezoelectric film) is disposed on a substrate B1 in each desired region thereof so as to be two-dimensionally staggered. In a region of the substrate B1 corresponding to the each region in which the ferroelectric thin film L4 is formed, a concave portion B1a is formed by cutting out a part of the substrate B1 in a thickness direction thereof in a shape circular in section, leaving a thin plate-shaped region B1b at an upper portion of the concave portion B1a (a bottom portion side of the concave portion B1a) in the substrate B1. A lower electrode layer D1 and an upper electrode layer D2 are connected to an external control circuit via unshown wiring.

By applying an electric signal from the control circuit to each of the lower electrode layer D1 and the upper electrode layer D2 sandwiching the predetermined ferroelectric thin film L4 therebetween, it is possible to drive only the predetermined ferroelectric thin film L4. That is, when a predetermined electric field is applied to each of electrodes above and below the ferroelectric thin film L4, the ferroelectric thin film L4 expands and contracts in a lateral direction, and due to a bimetal effect, the piezoelectric film L4 and the region B1b of the substrate B1 are curved up and down. By utilizing this, a gas or a liquid is filled in the concave portion B1a of the substrate B1, in which case the piezoelectric device 20 can be used as a pump.

Furthermore, by detecting a charge amount of the predetermined ferroelectric thin film L4 via the lower electrode layer D1 and the upper electrode layer D2, it is also possible to detect a deformation amount of the ferroelectric thin film L4. That is, when the ferroelectric thin film L4 is caused to vibrate by sound waves or ultrasonic waves, due to an effect adverse to the above-described effect, an electric field is generated between the electrodes above and below the ferroelectric thin film L4, and, at this time, a magnitude of the electric field generated and a frequency of a detection signal are detected, which allows the piezoelectric device 20 to be used also as a sensor.

<Other Embodiments>

While the foregoing has described PLZT using La as an additive, an additive used in the present invention is not limited to La and can be any of other types of additives that can exhibit a piezoelectric property. For example, at an A site in a perovskite structure having an $ABO_3$ configuration, as an additive to be used as a substituent, at least one type of metal material selected from a group consisting of Ba, La, Sr, Bi, Li, Na, Ca, Cd, Mg, and K can be used. Furthermore, at a B site, at least one type of metal material selected from a group consisting of V, Nb, Ta, Cr, Mo, W, Mn, Sc, Co, Cu, In, Sn, Ga, Cd, Fe, and Ni can be used. Furthermore, additives may be contained at both the A site and the B site, respectively.

As described above, a part of Pb located at an A site of PZT is substituted with a predetermined additive and a part of Zr or Ti located at a B site is substituted with a predetermined additive, so that it is possible to obtain a ferroelectric thin film that exhibits a predetermined piezoelectric property.

As described above, according to the ferroelectric thin film of the present invention, even in a case of using a dielectric material that varies in level of crystallinity and in piezoelectric property depending on an compounding concentration of an additive, by forming, in combination, a first layer having a compounding percentage of Zr smaller than a predetermined percentage and thus having excellent crystallinity and a second layer having a compounding percentage of Zr as large as the predetermined percentage and thus exhibiting an excellent piezoelectric property, a ferroelectric thin film of a predetermined thickness that exhibits a predetermined piezoelectric property can be formed with good crystallinity.

That is, it is possible to obtain a ferroelectric thin film that is a thin film of a ferroelectric body of a predetermined thickness formed with good crystallinity on a base body and exhibits a high piezoelectric property.

This makes it possible to form a thick film for an actuator having a thickness of about 3 to 5 μm with good crystallinity, and thus there can be obtained a ferroelectric thin film that is usable as a driving device for a MEMS actuator.

Furthermore, according to the method for producing a ferroelectric thin film of the present invention, a first layer having a compounding percentage of Zr smaller than a predetermined percentage and thus having excellent crystallinity and a second layer having a compounding percentage of Zr as large as the predetermined percentage and thus exhibiting an excellent piezoelectric property are formed in combination, so that it is possible to produce a ferroelectric thin film that is a thin film of a ferroelectric body of a predetermined thickness formed with good crystallinity on a base body and exhibits a high piezoelectric property.

Industrial Applicability

The present invention is applicable to various types of devices such as, for example, an ink-jet head, an ultrasonic sensor, an infrared sensor, and a frequency filter and applicable particularly to devices required to be reduced in size and in thickness.

LIST OF REFERENCE SYMBOLS

B1 substrate (silicon substrate)
L1 thermally oxidized film
D1 lower electrode layer
D2 upper electrode layer
L4 ferroelectric thin film (piezoelectric film)
L4A ferroelectric thin film (formed by a sequential film formation step)
L4B ferroelectric thin film (formed by a repetitive film formation step)
S3 first piezoelectric film formation (sequential film formation step)
S4 second piezoelectric film formation (sequential film formation step)
S16 repetitive film formation step
10 film forming apparatus

The invention claimed is:

1. A piezoelectric device, comprising:
a silicon substrate; and
a Pt film and a film of a dielectric material having a perovskite structure, which are arranged from the silicon substrate side in this order;
wherein the film of the dielectric material comprises layers different in Zr/Ti ratio, which are a first layer in which a compounding percentage of Zr is greater than zero but not more than 53% in Zr/Ti ratio and a second layer in which a compound percentage of Zr in Zr/Ti ratio is not less than that of the first layer, and the first layer is arranged between the Pt film and the second layer, and
wherein each of the first layer and the second layer is a PLZT layer which comprises La at 7 to 8% of a compounding concentration.

2. The piezoelectric device according to claim 1, wherein the La is used as a substituent for an A site in the perovskite structure having an $ABO_3$ configuration.

3. The piezoelectric device according to claim 1, wherein an additive is used as a substituent for a B site in the perovskite structure having an $ABO_3$ configuration and is at least one type of metal material selected from a group consisting of V, Nb, Ta, Cr, Mo, W, Mn, Sc, Co, Cu, In, Sn, Ga, Cd, Fe, and Ni.

4. The piezoelectric device according to claim 1, wherein the film of the dielectric material has, on the second layer, a stacked layer structure equivalent to a stacked layer structure composed of the first layer and the second layer.

5. The piezoelectric device according to claim 1, wherein layers different in Zr/Ti ratio are stacked on each other toward a thickness direction of the thin film.

6. The piezoelectric device according to claim 1, wherein the film of the dielectric material has a total thickness of 3 to 5 μm.

7. A method for producing a ferroelectric thin film in the piezoelectric device according to claim 1 comprising:
a piezoelectric film formation step that uses a sputtering-type film forming apparatus that forms a film on a base body by using a dielectric material as a target material and in which, as the target material, target materials having different predetermined values of a Zr/Ti ratio are used to form the first layer on the base body and the second layer on said first layer.

8. The piezoelectric device according to claim 1, wherein the device comprises a $SiO_2$ film and a Ti film which are arranged in this order between the silicon substrate and the Pt film.

9. The piezoelectric device according to claim 1, wherein the film of the dielectric material is oriented mainly in the direction of (100) or in the direction of (111).

10. A piezoelectric device, comprising:
a silicon substrate; and
a Pt film and a film of a dielectric material having a perovskite structure, which are arranged from the silicon substrate side in this order,
wherein the film of the dielectric material comprises layers of a composite oxide different in Zr/Ti ratio, which are a first layer of the composite oxide in which a compounding percentage of Zr is greater than zero but not more than 53% in Zr/Ti ratio and a second layer of the composite oxide in which a compound percentage of Zr in Zr/Ti ratio is not less than that of the first layer, and the first layer is arranged between the Pt film and the second layer, and
wherein each of the first layer and the second layer is a PLZT layer which comprises La at 7 to 8% of a compounding concentration.

11. The piezoelectric device according to claim 10, wherein the La is used as a substituent for an A site in the perovskite structure having an $ABO_3$ configuration.

12. The piezoelectric device according to claim 10, wherein an additive is used as a substituent for a B site in the perovskite structure having an $ABO_3$ configuration and is at least one type of metal material selected from a group consisting of V, Nb, Ta, Cr, Mo, W, Mn, Sc, Co, Cu, In, Sn, Ga, Cd, Fe, and Ni.

13. The piezoelectric device according to claim 10, wherein the film of a dielectric material has, on the second layer, a stacked layer structure equivalent to a stacked layer structure composed of the first layer and the second layer.

14. The piezoelectric device according to claim 10, wherein layers different in Zr/Ti ratio are stacked on each other toward a thickness direction of the thin film.

15. The piezoelectric device according to claim 10, wherein the film of the dielectric material has a total thickness of 3 to 5 µm.

16. A method for producing a ferroelectric thin film in the piezoelectric device according to claim 10 comprising:
a piezoelectric film formation step that uses a sputtering-type film forming apparatus that forms a film on a base body by using a dielectric material as a target material and in which, as the target material, target materials having different predetermined values of a Zr/Ti ratio are used to form the first layer on the base body and the second layer on said first layer.

* * * * *